US012696417B2

(12) United States Patent (10) Patent No.: US 12,696,417 B2
Jiang et al. (45) Date of Patent: Jul. 28, 2026

(54) SERVER AND CHASSIS STRUCTURE THEREOF

(71) Applicant: SUZHOU METABRAIN INTELLIGENT TECHNOLOGY CO., LTD., Suzhou (CN)

(72) Inventors: Shaonan Jiang, Suzhou (CN); Wei Gao, Suzhou (CN); Shengfu Liu, Suzhou (CN); Xiaomao Li, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 102 days.

(21) Appl. No.: 18/723,674

(22) PCT Filed: Sep. 28, 2022

(86) PCT No.: PCT/CN2022/122306
§ 371 (c)(1),
(2) Date: Jun. 24, 2024

(87) PCT Pub. No.: WO2023/206965
PCT Pub. Date: Nov. 2, 2023

(65) Prior Publication Data
US 2025/0063682 A1 Feb. 20, 2025

(30) Foreign Application Priority Data
Apr. 29, 2022 (CN) .......................... 202210465690.2

(51) Int. Cl.
*H05K 7/14* (2006.01)

(52) U.S. Cl.
CPC .................................. *H05K 7/1488* (2013.01)

(58) Field of Classification Search
None
See application file for complete search history.

(56) References Cited

U.S. PATENT DOCUMENTS 5,677,830 A * 10/1997 Nogas .................. H05K 7/1435
                                                      361/732
5,992,953 A * 11/1999 Rabinovitz ............... G06F 1/18
                                                      439/701

(Continued)

FOREIGN PATENT DOCUMENTS

CN       102043448 A      5/2011
CN       102833973 A      12/2012

(Continued)

OTHER PUBLICATIONS

International Search Report in Application No. PCT/CN2022/122306, Dec. 20, 2022.

(Continued)

*Primary Examiner* — Allen L Parker
*Assistant Examiner* — Christopher L Augustin
(74) *Attorney, Agent, or Firm* — Merchant & Gould P.C.

(57) ABSTRACT

Disclosed are a server and a chassis structure thereof. The chassis structure includes a first chassis body and a second chassis body; the first chassis body is provided with a first snap male member and a second snap male member; the second chassis body is provided with a first snap female member and a second snap female member; the second snap female member includes a movable snap, the movable snap is movably arranged on the second chassis body, and the movable snap is configured to move relative to the second chassis body along a first direction. During installation, first, the first snap male member is snap-fitted with the first snap female member, and then the movable snap is moved in a transverse direction, so that the second snap male member is snap-fitted with the movable snap.

19 Claims, 6 Drawing Sheets

(56) References Cited

U.S. PATENT DOCUMENTS

| | | | | |
|---|---|---|---|---|
| 6,661,648 | B2 * | 12/2003 | Dayley | .................... H05K 5/30 |
| | | | | 361/679.6 |
| 7,239,509 | B1 * | 7/2007 | Roeske | ................. G06F 1/1632 |
| | | | | 361/679.02 |
| 9,696,761 | B1 * | 7/2017 | Truong | .................... G06F 1/181 |
| 10,587,075 | B1 | 3/2020 | Lin et al. | |
| 2013/0258560 | A1 | 10/2013 | Wang et al. | |
| 2020/0196466 | A1 * | 6/2020 | Fischl | ................. H05K 5/0221 |

FOREIGN PATENT DOCUMENTS

| | | | |
|---|---|---|---|
| CN | 104423492 | A | 3/2015 |
| CN | 110888509 | A | 3/2020 |
| CN | 211297401 | U | 8/2020 |
| CN | 114690865 | A | 7/2022 |

OTHER PUBLICATIONS

Chinese Search Report issued for Chinese Patent Application No. 2022104656902.

* cited by examiner

SERVER AND CHASSIS STRUCTURE THEREOF

CROSS-REFERENCE TO RELATED APPLICATION

The present disclosure is a National Stage Filing of the PCT International Application No. PCT/CN2022/122306 filed on Sep. 28 2022, which claims priority and the benefit of Chinese Patent Application No. 202210465690.2, filed with the China National Intellectual Property Administration (CNIPA) on Apr. 29 2022 and entitled "server and chassis structure thereof", which is hereby incorporated by reference in its entirety.

TECHNICAL FIELD

The present disclosure relates to the technical field of servers, and in particular, to a chassis structure. The present disclosure also relates to a server having the chassis structure.

BACKGROUND

In recent years, edge computing has developed rapidly, and a device used for edge computing is generally referred to as an edge server or an edge box, the edge box is characterized by diverse application scenarios, flexible deployment, general storage and computing capability of a single machine, and small volume. Therefore, multiple edge boxes need to be assembled into a small cluster, but the specific number varies according to different usage requirements. How to quickly and securely form different numbers of edge boxes into one cluster to meet requirements of different scenarios is an important research direction.

In the related art, a combined chassis structure includes a main chassis and at least two chassis which are mutually superposed and connected, i.e. a first combined chassis and a second combined chassis. The first combined chassis and the second combined chassis are connected by a fixing slot and a positioning post by means of embedding. However, the connection method lacks a locking structure, which can easily cause the two chassis to be separated easily during vibration and collision or when being carried; at the same time, there is a distinction between the main chassis and the combined chassis within this chassis structure, with the main chassis being required to be on top; furthermore, the structure also imposes a requirement on the number of chassis, allowing only one main chassis to be paired with two or more combined chassis. In conclusion, although the chassis structure can be combined, the reliability and flexibility of the chassis structure are insufficient.

SUMMARY

The object of the present disclosure is to provide a chassis structure, which is convenient to assemble and disassemble, and has high connection stability and flexibility. Another object of the present disclosure is to provide a server including the chassis structure.

In order to achieve the described object, some embodiments of the present disclosure provide a chassis structure, including a first chassis body and a second chassis body, the first chassis body is provided with a first snap male member and a second snap male member, the second chassis body is provided with a first snap female member and a second snap female member, the second snap female member includes a movable snap, and the movable snap is movably arranged on the second chassis body and is configured to move relative to the second chassis body along a first direction;

after the first snap male member is snap-fitted with the first snap female member, the movable snap moves along the first direction, such that the first chassis body is connected to the second chassis body after the second snap male member is snap-fitted with the movable snap.

In some embodiments, the second chassis body is provided with a limiting post, the movable snap is provided with a limiting groove for insertion of the limiting post, a size of the limiting groove along the first direction is greater than a size of the limiting post along the first direction, so that the movable snap moves on the second chassis body along the first direction.

In some embodiments, the movable snap includes a second snap end, the first chassis body is provided with a second groove, the second snap male member is arranged on the second groove, and a size of the second groove along the first direction is greater than a size of the second snap male member along the first direction; and the second snap end is inserted into the second groove and is snap-fitted between the second snap male member and the second chassis body, so that the second snap male member is snap-fitted with the movable snap.

In some embodiments, the first snap female member includes a first snap end and a root, a first slot is formed between the first snap end and the root, the first chassis body is provided with a first groove, the first snap male member is arranged on the first groove and a second slot is formed between the first snap male member and the first groove, the first snap end is snapped into the second slot, and the first snap male member is snapped into the first slot, so that the first snap male member is snap-fitted with the first snap female member.

In some embodiments, the second snap female member further includes a positioning structure, the positioning structure is detachably connected to the second chassis body and abuts against the movable snap, and the positioning structure is configured to limit a movement of the movable snap along the second direction.

In some embodiments, further including a reset driving member, the reset driving member is configured to provide a reset driving force for the movable snap, so that the movable snap has a tendency of moving away from the positioning structure.

In some embodiments, the reset driving member includes a first magnet and a second magnet, the first magnet and the second magnet are respectively arranged on the movable snap and the positioning structure, and a repulsive force is formed between the first magnet and the second magnet, so that the movable snap has the tendency of moving away from the positioning structure.

In some embodiments, the reset driving member is an elastic member arranged between the movable snap and the positioning structure, and the elastic member is configured to provide an elastic force for the movable snap, so that the movable snap has the tendency of moving away from the positioning structure.

In some embodiments, the movable snap is provided with a first accommodation groove, the first magnet is arranged in the first accommodation groove, the positioning structure is provided with a second accommodation groove, and the second magnet is arranged in the second accommodation groove.

Some other embodiments of the present disclosure further provide a server, which includes the described chassis structure.

With respect to the above background, the chassis structure provided by the embodiments of the present disclosure includes a first chassis body and a second chassis body, the first chassis body is provided with a first snap male member and a second snap male member, the second chassis body is provided with a first snap female member and a second snap female member, the second snap female member includes a movable snap, and the movable snap is movably arranged on the second chassis body and is configured to move relative to the second chassis body along a first direction; it should be noted that the first direction is a transverse direction or a horizontal direction. In this way, during installation, first, the first snap male member is snap-fitted with the first snap female member, and then the movable snap is moved in the transverse direction, so that the second snap male member is snap-fitted with the movable snap, thereby achieving connection between the first chassis body and the second chassis body. Compared with traditional chassis structures, the chassis structure provided by the embodiments of the present disclosure may be assembled and disassembled quickly, and the chassis are firm and reliable in assembly, and may resist vibration and impact collisions, etc., and the number thereof may also be flexible and variable according to application requirements, so as to meet the requirements of various scenarios on the number of different chassis; furthermore, a connection manner of the chassis structure may be applied to chassis of any size, and even chassis of different heights and different configurations may be combined together, which is very flexible and may meet the requirements of different customers.

BRIEF DESCRIPTION OF THE DRAWINGS

To describe the technical solutions in the embodiments of present disclosure or in the related art more clearly, the following briefly describes the accompanying drawings required for describing the embodiments or the related art. Apparently, the accompanying drawings in the following description show merely some embodiments of the present disclosure, and a person of ordinary skill in the art may still derive other embodiments from these accompanying drawings without creative efforts.

wherein:

10: first chassis body, 11: first snap male member, 12: second snap male member, 13: first groove, 14: second groove, 15: second slot, 20: second chassis body, 21: first snap female member, 211: first snap end, 212: root, 213: first slot, 22: second snap female member, 221: movable snap, 2211: second snap end, 2212: first accommodation groove, 222: positioning structure, 2221: second accommodation groove, 223: limiting groove, 23: limiting post, 24: first magnet, 25: second magnet.

DETAILED DESCRIPTION OF THE EMBODIMENTS

Hereinafter, the technical solutions in the embodiments of the present disclosure will be described clearly and thoroughly with reference to the accompanying drawings of the embodiments of the present disclosure. Obviously, the embodiments as described are only some of the embodiments of the present disclosure, and are not all of the embodiments of the present disclosure. All other embodiments obtained by those of ordinary skill in the art on the basis of the embodiments in the application without creative work shall fall within the scope of protection of the application.

To make a person skilled in the art better understand the solutions of the present disclosure, the present disclosure is further described in detail with reference to the accompanying drawings and specific embodiments.

It should be noted that, terms such as "upper end, lower end, left side, right side" in the following text are all defined based on the accompanying drawings.

Figure 2:
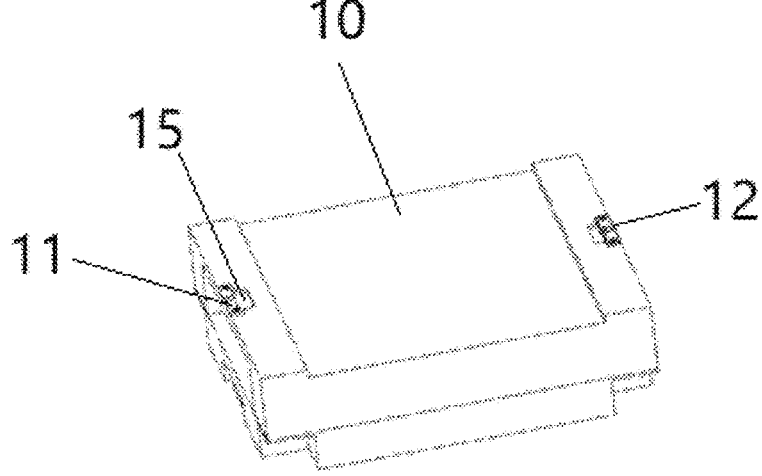
FIG. 2 is a structural schematic diagram of a first chassis body in the chassis structure shown in FIG. 1.
Figure 3:
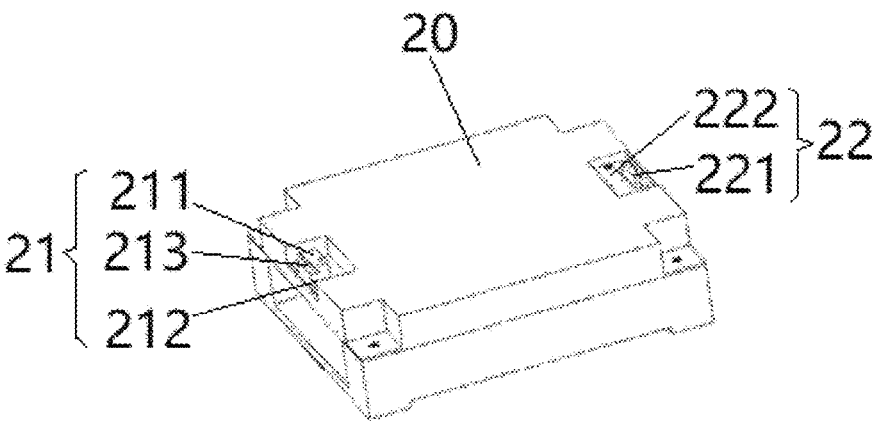
FIG. 3 is a structural schematic diagram of a second chassis body in the chassis structure shown in FIG. 1.
Figure 4:
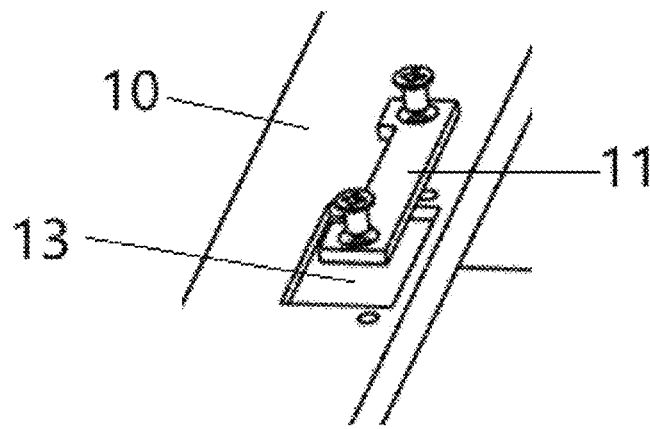
FIG. 4 is a schematic diagram of installation of a first snap male member on the first chassis body shown in FIG. 2.
Figure 5:
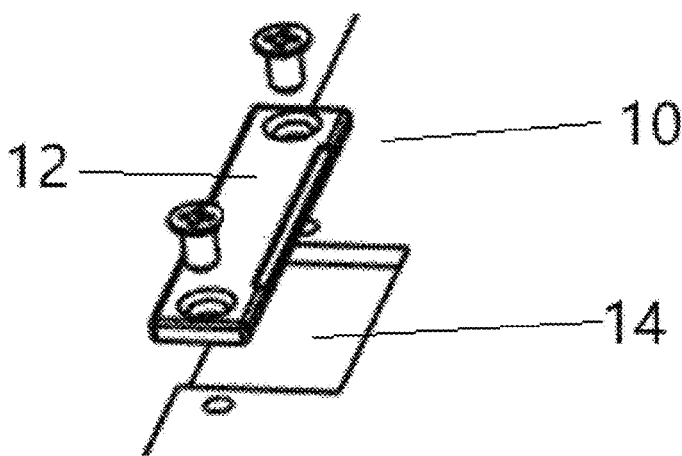
FIG. 5 is a schematic diagram of installation of a second snap male member on the first chassis body shown in FIG. 2.
Figure 6:
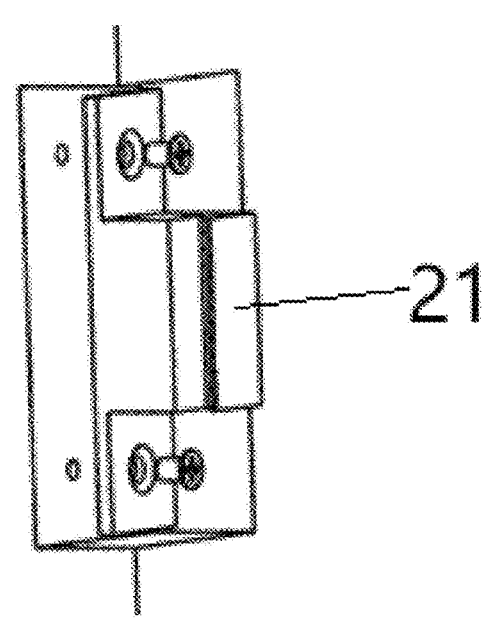
FIG. 6 is a schematic diagram of installation of a first snap female member on the second chassis body shown in FIG. 3.
Figure 7:
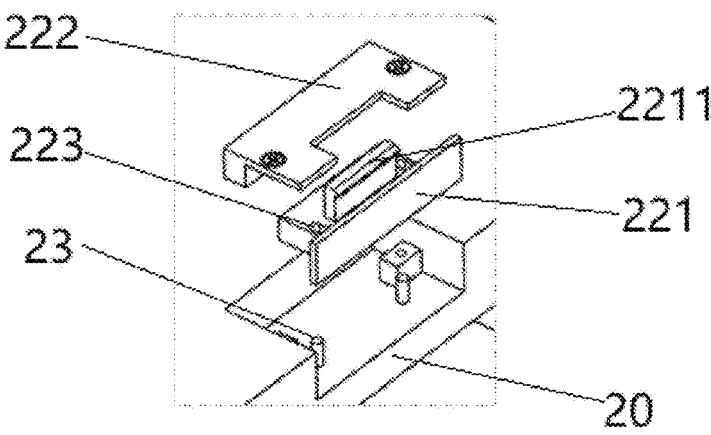
FIG. 7 is a schematic diagram of installation of a second snap female member on the second chassis body shown in FIG. 3.
Figure 8:
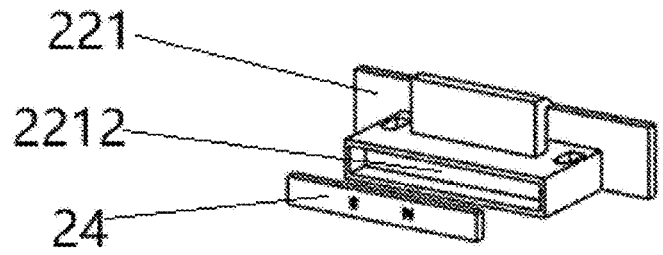
FIG. 8 is a schematic diagram of assembly of a movable snap with a first magnet in the second snap female member shown in FIG. 7.
Figure 9:
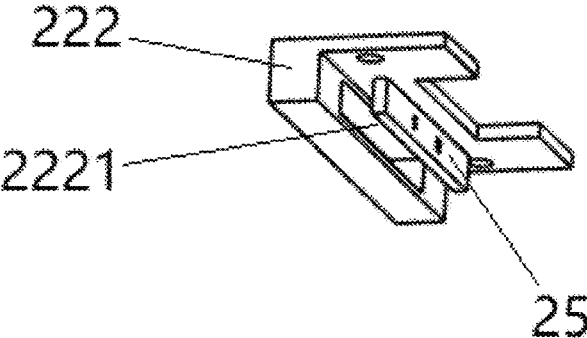
FIG. 9 is a schematic diagram of assembly of a positioning structure with a second magnet in the second snap female member shown in FIG. 7.
Figure 10:
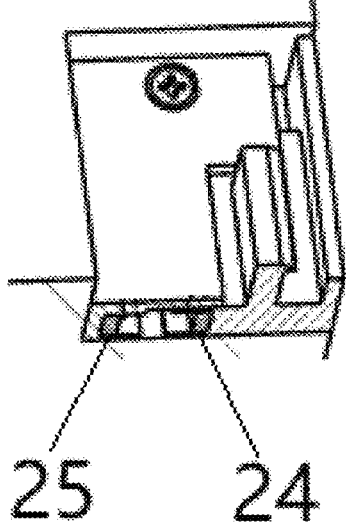
FIG. 10 is a cross-sectional view of the second snap female member shown in FIG. 7.
Figure 11:
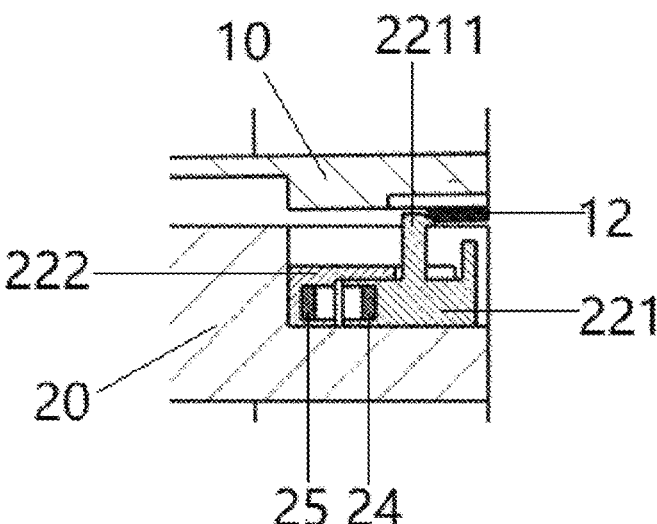
FIG. 11 is a schematic diagram of a chassis structure in which a second snap male member starts to push a movable snap to move to the left during assembly according to an embodiment of the present disclosure.
Figure 12:
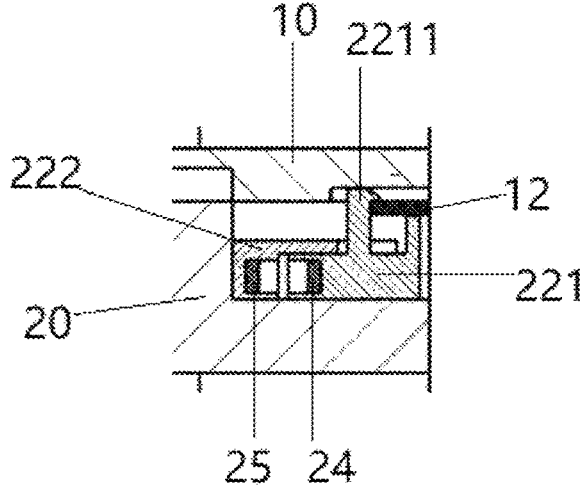
FIG. 12 is a schematic diagram of a chassis structure after the second snap male member is snap-fitted with the movable snap during assembly according to an embodiment of the present disclosure.
Figure 13:
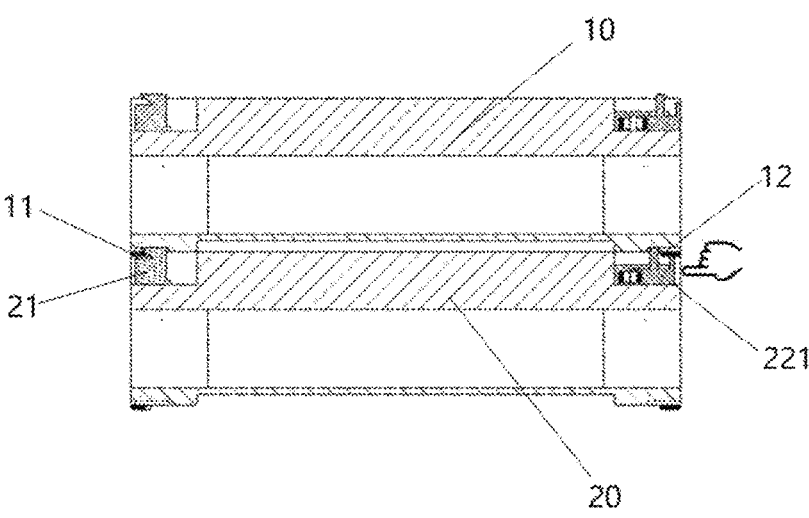
FIG. 13 is a schematic diagram of disassembly of a chassis structure according to an embodiment of the present disclosure.
Figure 14:
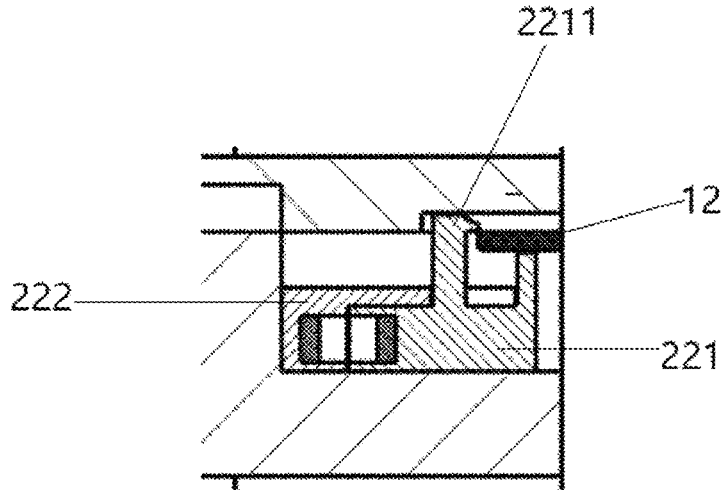
FIG. 14 is a schematic diagram of a chassis structure after the second snap male member is unlocked with the movable snap during disassembly according to an embodiment of the present disclosure.

Please refer to FIGS. 1-14, FIG. 1 is a schematic diagram of a combination of chassis structures according to an embodiment of the present disclosure; FIG. 2 is a structural schematic diagram of a first chassis body in the chassis structure shown in FIG. 1; FIG. 3 is a structural schematic diagram of a second chassis body in the chassis structure shown in FIG. 1; FIG. 4 is a schematic diagram of installation of a first snap male member on the first chassis body shown in FIG. 2; FIG. 5 is a schematic diagram of installation of a second snap male member on the first chassis body shown in FIG. 2; FIG. 6 is a schematic diagram of installation of a first snap female member on the second chassis body shown in FIG. 3; FIG. 7 is a schematic diagram of installation of a second snap female member on the second chassis body shown in FIG. 3; FIG. 8 is a schematic diagram of assembly of the movable snap with the first magnet in the second snap female member shown in FIG. 7; FIG. 9 is a schematic diagram of assembly of a positioning structure with a second magnet in the second snap female member shown in FIG. 7; FIG. 10 is a cross-sectional view of the second snap female member shown in FIG. 7; FIG. 11 is a schematic diagram of a chassis structure in which a second snap male member starts to push a movable snap to move to the left during assembly according to an embodiment of the present disclosure; FIG. 12 is a schematic diagram of a chassis structure after the second snap male member is snap-fitted with the movable snap during assembly according to an embodiment of the present disclosure; FIG. 13 is a schematic diagram of disassembly of a chassis structure according to an embodiment of the present disclosure; FIG. 14 is a schematic diagram of a chassis structure after the second snap male member is unlocked with the movable snap during disassembly according to an embodiment of the present disclosure.

The chassis structure provided by the embodiment of the present disclosure includes a first chassis body 10 and a second chassis body 20, the first chassis body 10 is provided with a first snap male member 11 and a second snap male member 12, the second chassis body 20 is provided with a first snap female member 21 and a second snap female member 22. The first snap male member 11 is connected to the first snap female member 21 in a fit manner, and the second snap male member 12 is connected to the second snap female member 22 in a fit manner.

In some embodiments, the first snap male member 11 and the second snap male member 12 are arranged at a bottom of the first chassis body 10 and respectively arranged at positions close to an end face of the first chassis body 10, and the first snap female member 21 and the second snap female member 22 are arranged at a top of the second chassis body 20 and respectively arranged at positions close to an end face of the second chassis body 20.

In an embodiment, the first snap male member 11 and the second snap male member 12 are located on an axial direction of a lengthwise direction of the first chassis body 10; and the first snap female member 21 and the second snap female member 22 are located on an axial direction of a lengthwise direction of the second chassis body 20.

In this way, the first snap male member 11 may be first snap-fitted with the first snap female member 21, and then the second snap male member 12 may be snap-fitted with the second snap female member 22, such that the first chassis body 10 is combined and connected with the second chassis body 20.

Further, the second snap female member 22 includes a movable snap 221, the movable snap 221 is movably arranged on the second chassis body 20, and the movable snap 221 is configured to move relative to the second chassis body 20 along a first direction.

Figure 1:
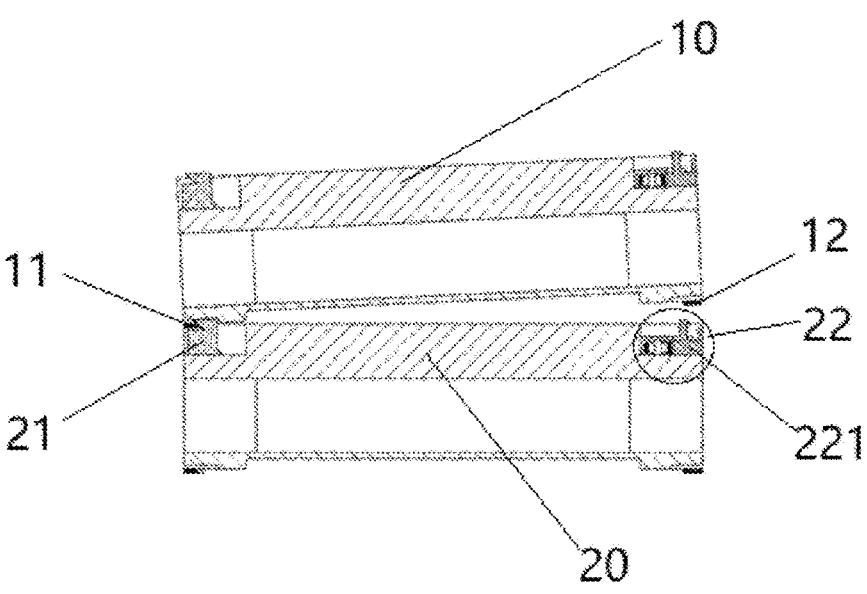
FIG. 1 is a schematic diagram of a combination of a chassis structure according to an embodiment of the present disclosure.

It should be noted that the first direction is a transverse direction or a horizontal direction as shown in FIG. 1.

In this way, during installation, first, the first snap male member 11 is snap-fitted with the first snap female member 21, and then the movable snap 221 is moved in the transverse direction, so that the second snap male member 12 is snap-fitted with the movable snap 221. In this way, a connection between the first chassis body 10 and the second chassis body 20 may be achieved.

Compared with traditional chassis structures, the chassis structure provided by the embodiments of the present disclosure may be assembled and disassembled quickly, and the chassis are firm and reliable in assembly, and may resist vibration and impact collisions, etc., and the number thereof may also be flexible and variable according to application requirements, so as to meet the requirements of various scenarios on the number of different chassis; furthermore, a connection manner of the chassis structure may be applied to chassis of any size, and even chassis of different heights and different configurations may be combined together, which is very flexible and may meet the requirements of different customers.

In some embodiments, the movable snap 221 is able to be movably connected to the second case 20 by means of a fitting of a limiting post 23 and a limiting groove 223.

In some embodiments, the movable snap 221 is provided with the limiting groove 223, the second chassis body 20 is provided with the limiting post 23, the limiting post 23 is inserted into the limiting groove 223, and a size of the limiting groove 223 along the first direction is greater than a size of the limiting post 23 along the first direction, so that the movable snap 221 moves on the second chassis body 20 along the first direction.

That is to say, the movable snap 221 is fitted with the limiting post 23 on a top surface of the second chassis body 20 by means of the limiting groove 223, and the limiting post 23 is arranged along a second direction which is a longitudinal direction or a vertical direction. In this way, the movable snap 221 may move along the transverse direction. Furthermore, a length of the limiting groove 223 determines a movement stroke of the movable snap 221.

Of course, the movable snap 221 may also be slidably connected to the second chassis body 20 by using a fitting of a sliding rail and a sliding groove.

In some embodiments, in order to facilitate the connection between the first snap male member 11 and the first snap female member 21, the first snap female member 21 is provided with a slot structure, and correspondingly, the first snap male member 11 is snap-fitted with the slot structure of the first snap female member 21, thereby achieving connection between the two.

In some embodiments, the first snap female member 21 includes a first snap end 211 and a root 212, a first slot 213 is formed between the first snap end 211 and the root 212, the first chassis body 10 is provided with a first groove 13, the first snap male member 11 is arranged on the first groove 13, a size of the first groove 13 along the first direction is greater than a size of the first snap male member 11 along the first direction, and a second slot 15 is formed between the first snap male member 11 and the first groove 13. In this way, the first snap end 211 is snapped into the second slot 15, and the first snap male member 11 is snapped into the first slot 213, so that the first snap male member 11 is snap-fitted with the first snap female member 21.

Of course, according to actual needs, the first snap male member 11 is specifically a square plate with a notch at a front end thereof, and in order to facilitate snap-fitting of the first snap end 211 into the second snap groove 15, a side of the first snap end 211 away from the movable snap 221 is provided with a first inclined surface, and correspondingly, an inner wall of the notch of the square plate is provided with a second inclined surface, and the second inclined surface is fitted with the first inclined surface. Such an arrangement facilitates snap-fitting of the first inclined surface of the first snap end 211 into the second snap groove 15 formed by the first snap male member 11 and the first groove 13 along the second inclined surface.

In some embodiments, the movable snap 221 includes a second snap end 2211, the second snap end 2211 is provided with a protrusion or a tip end protruding to the right side; the first chassis body 10 is provided with a second groove 14; the second snap male member 12 is arranged on the second groove 14; and a size of the second groove 14 along the first direction is greater than a size of the second snap male member 12 along the first direction. In this way, the second snap end 2211 is inserted into the second groove 14 and is snap-fitted between the second snap male member 12 and the second chassis body 20, so that the second snap male member 12 is snap-fitted with the movable snap 221.

It should be noted that, because the movable snap 221 is movably arranged on the second case 20, when the second snap male member 12 is snap-fitted with the movable snap 221, the movable snap 221 on the rightmost side may be first moved leftwards until the second snap male member 12 passes over the tip end of the second snap end 2211 protruding rightwards, and then the movable snap 221 is moved rightwards to a position where the second snap male member 12 is snap-fitted below the second snap end 2211, so that the second snap male member 12 is snap-fitted with the movable snap 221.

In some embodiments, the second snap female member 22 further includes a positioning structure 222; the positioning structure 222 is detachably connected to the second chassis body 20 and abuts against the movable snap 221; the positioning structure 222 is able to be locked and attached to a top surface of the second chassis body by means of a screw; and the positioning structure 222 is configured to limit a movement of the movable snap 221 along the second direction.

That is to say, the movable snap 221 is fitted with the limiting groove 23 on the top surface of the second chassis body 20 by means of the limiting groove 223, and the positioning structure 222 presses the movable snap 221, so that the movable snap 221 is fixed in the longitudinal direction and is able to move in the transverse direction.

In some embodiments, the chassis structure further includes a reset driving member, the reset driving member is configured to provide a reset driving force for the movable snap 221, so that the movable snap 221 has a tendency of moving away from the positioning structure 222.

In this way, when the second snap male member 12 passes over the second snap end 2211, the reset driving member provides the reset driving force along the first direction for the movable snap 221, so that the movable snap 221 always has the tendency of moving away from the positioning structure 222. In this way, under an action of the reset driving force, the movable snap 221 moves to the right again, and tightly presses the second snap male member 12, thereby achieving quick combination of the two chassis, and under the action of the reset driving force, a connection between the two chassis is stable and reliable.

In some embodiments, the reset driving member includes a first magnet 24 and a second magnet 25, the first magnet 24 and the second magnet 25 are respectively arranged on the movable snap 221 and the positioning structure 222, and a repulsive force is formed between the first magnet 24 and the second magnet 25, so that the movable snap 221 has the tendency of moving away from the positioning structure 222.

In the embodiment, when the first chassis body 10 and the second chassis body 20 are assembled in an upper and lower arrangement, the first snap male member 11 of the upper first chassis body 10 is first snap-fitted with the first snap female member 21 of the lower second chassis body 20, and then the other side of the upper first chassis body 10 is pressed, so that the second snap male member 12 of the first chassis body 10 pushes downwards the second snap female member 22 of the lower second chassis body 20. The movable snap 221 of the second snap female member 22 is originally pushed to the rightmost side due to the repulsive force between the magnets; during combination, due to a pushing of the second snap male member 12 of the upper first chassis body 10, the movable snap 221 will move to the left against the repulsive force between the magnets until the second snap male member 12 passes downwards over the tip end of the second snap end 22 protruding to the right side, and is snap-fitted at a position of the movable snap 221 below the tip end, in this case, the movable snap 221 is no longer pushed to the left, and therefore moves to the right again under the repulsive force between the magnets, and tightly presses the second snap male member 12.

In this way, the two chassis may be quickly combined, and the connection is stable and reliable under the repulsive force of the magnet.

In some embodiments, the movable snap 221 includes a first structural frame, the movable snap 221 is integrally formed with the first structural frame, the first structural frame is provided with a first accommodation groove 2212, the first magnet 24 is arranged in the first accommodation groove 2212, the positioning structure 222 includes a second structural frame, the second structural frame is provided with a second accommodation groove 2221, and the second magnet 25 is arranged in the second accommodation groove 2221. The first magnet 24 and the second magnet 25 are arranged opposite to each other, and a repulsive force may be formed after the two magnets are installed.

In some embodiments, the reset driving member is also an elastic member, such as a compression spring, the elastic member is arranged between the movable snap 221 and the positioning structure 222, and is configured to provide an elastic force for the movable snap 221, so that the movable snap 221 has the tendency of moving away from the positioning structure 222. An action principle of the elastic force provided by the elastic member is similar to an action principle of the repulsive force between the two magnets, and the premise is that the movable snap 221 is ensured to have the tendency of moving away from the positioning structure 222, thereby achieving a firmness and stability of the connection between the second snap male member 12 and the second snap female member 22.

It should be noted that, in order to ensure that the second snap male member 12 is able to firstly push the movable snap 221 of the second snap female member 22 to move left until the movable snap 221 passes over the tip end of the movable snap 221 and is snap-fitted at a position below the tip end of the movable snap 221, finally, the repulsive force of two magnets or the elastic force of the elastic member pushes the movable snap 221 to tightly press the second snap male member 12, chamfers of the second snap male member 12 and the movable snap 221 need to be fitted well, and a size of the tip end of the movable snap 221 also needs to be adapted to the stroke of the movable snap 221.

In addition, it is also convenient to disassembly the two chassis, and it is only required to push the movable snap 221 with a finger to overcome the repulsive force of the two magnets or the elastic force of the elastic member to make the movable snap 221 move to the left until the tip end disengages from the second snap male member 12, in this case, the second snap male member 12 loses a pressing force, and the first chassis body 10 is able to be separated from the second chassis body 20 by lifting upwards the upper first case 10.

In conclusion, processes of combination and disassembly of the first chassis body 10 and the second chassis body 20 are as stated above, and in this manner, any number of chassis may be combined, thereby achieving rapid and reliable cluster deployment.

A server provided in the present disclosure includes a chassis structure described in the foregoing embodiments. For other parts of the server, reference may be made to the related art, and no further description is provided herein.

It should be noted that, in the description, relational terms such as first and second are only used to distinguish one entity from other entities, and do not require or imply any actual relationship or sequence between these entities.

The server and the chassis structure thereof provided in the present disclosure are introduced in details above. Specific examples have been applied herein to illustrate the principle and embodiments of the present disclosure, and the description of the above embodiments is only used to help understand the method and core concept of the present disclosure. It should be noted that, a person of ordinary skill in the art may further make improvements and modifications to the present disclosure without departing from the principle of the present disclosure, and these improvements and modifications also belong to the scope of protection of the claims of the present disclosure.

What is claimed is:

1. A chassis structure, comprising a first chassis body and a second chassis body, the first chassis body is provided with a first snap male member and a second snap male member, the second chassis body is provided with a first snap female member and a second snap female member, the second snap female member comprises a movable snap, and the movable snap is movably arranged on the second chassis body and is configured to move relative to the second chassis body along a first direction;

after the first snap male member is snap-fitted with the first snap female member, the movable snap moves along the first direction, such that the first chassis body is connected to the second chassis body after the second snap male member is snap-fitted with the movable snap;

the movable snap is provided with a sliding groove, and the second chassis body is provided with a sliding rail; the movable snap is fitted with the sliding rail by means of the sliding groove, so that the movable snap is movably arranged on the second chassis body.

2. The chassis structure according to claim 1, wherein the first snap male member and the second snap male member are arranged on a side surface of the first chassis body close to the second chassis body; and the first snap female member and the second snap female member are arranged on a side surface of the second chassis body close to the first chassis body.

3. The chassis structure according to claim 1, wherein the first snap male member is arranged on one end face of the first chassis body, and the second snap male member is arranged on the other end face of the first chassis body; and the first snap female member is arranged on one end face of the second chassis body, and the second snap female member is arranged on the other end face of the second chassis body.

4. The chassis structure according to claim 1, wherein the first snap male member and the second snap male member are located on the same axial direction of the first chassis body; and the first snap female member and the second snap female member are located on the same axial direction of the second chassis body.

5. The chassis structure according to claim 4, wherein the first snap male member and the second snap male member are located on an axial direction of a lengthwise direction of the first chassis body; and the first snap female member and the second snap female member are located on an axial direction of a lengthwise direction of the second chassis body.

6. The chassis structure according to claim 1, wherein the second chassis body is provided with a limiting post, the movable snap is provided with a limiting groove for insertion of the limiting post, a size of the limiting groove along the first direction is greater than a size of the limiting post along the first direction, so that the movable snap moves on the second chassis body along the first direction.

7. The chassis structure according to claim 6, wherein the limiting post is arranged on the second chassis body along a second direction.

8. The chassis structure according to claim 7, wherein the first direction is perpendicular to the second direction.

9. The chassis structure according to claim 1, wherein the movable snap comprises a second snap end, the first chassis body is provided with a second groove, the second snap male member is arranged on the second groove, and a size of the second groove along the first direction is greater than a size of the second snap male member along the first direction; and the second snap end is inserted into the second groove and is snap-fitted between the second snap male member and the second chassis body, so that the second snap male member is snap-fitted with the movable snap.

10. The chassis structure according to claim 9, wherein a side of the second snap end close to the second snap male member is provided with a protrusion.

11. The chassis structure according to claim 1, wherein the first snap female member comprises a first snap end and a root, a first slot is formed between the first snap end and the root, the first chassis body is provided with a first groove, the first snap male member is arranged on the first groove and a second slot is formed between the first snap male member and the first groove, the first snap end is snapped into the second slot, and the first snap male member is snapped into the first slot, so that the first snap male member is snap-fitted with the first snap female member.

12. The chassis structure according to claim 1, wherein a side of the first snap end away from the second snap male member is provided with a second inclined surface, a side of the first snap end away from the movable snap is provided with a first inclined surface, and the second inclined surface is fitted with the first inclined surface.

13. The chassis structure according to claim 1, wherein the second snap female member further comprises a positioning structure, the positioning structure is detachably connected to the second chassis body and abuts against the movable snap, and the positioning structure is configured to limit a movement of the movable snap along the second direction.

14. The chassis structure according to claim 13, wherein further comprising a reset driving member, the reset driving member is configured to provide a reset driving force for the movable snap, so that the movable snap has a tendency of moving away from the positioning structure.

15. The chassis structure according to claim 14, wherein the reset driving member comprises a first magnet and a second magnet, the first magnet and the second magnet are respectively arranged on the movable snap and the positioning structure, and a repulsive force is formed between the first magnet and the second magnet, so that the movable snap has the tendency of moving away from the positioning structure.

16. The chassis structure according to claim 15, wherein the first magnet is arranged opposite to the second magnet.

17. The chassis structure according to claim 14, wherein the reset driving member is an elastic member arranged between the movable snap and the positioning structure, and the elastic member is configured to provide an elastic force for the movable snap, so that the movable snap has the tendency of moving away from the positioning structure.

18. The chassis structure according to claim 15, wherein the movable snap is provided with a first accommodation groove, the first magnet is arranged in the first accommodation groove, the positioning structure is provided with a second accommodation groove, and the second magnet is arranged in the second accommodation groove.

19. A server, comprising the chassis structure according to claim 1.

\*    \*    \*    \*    \*